US 6,404,110 B1

(12) United States Patent
Nakashima et al.

(10) Patent No.: US 6,404,110 B1
(45) Date of Patent: Jun. 11, 2002

(54) SURFACE ACOUSTIC WAVE ELEMENT HAVING A BUMP ELECTRODE AND SURFACE ACOUSTIC WAVE DEVICE COMPRISING THE SAME

(75) Inventors: Koji Nakashima, Ishikawa-ken; Hideya Morishita, Matto; Hiromichi Yamada, Ishikawa-ken, all of (JP)

(73) Assignee: Murata Manufacturing Co., LTD, Kyoto (JP)

( * ) Notice: Subject to any disclaimer, the term of this patent is extended or adjusted under 35 U.S.C. 154(b) by 0 days.

(21) Appl. No.: 09/074,824

(22) Filed: May 8, 1998

(30) Foreign Application Priority Data

May 16, 1997 (JP) .............................................. 9-127207

(51) Int. Cl.$^7$ ............................................. H01L 41/08
(52) U.S. Cl. ................................... 310/364; 310/313 R
(58) Field of Search ................................. 310/363, 364, 310/313 R, 313 A, 313 B; 333/150–155, 195

(56) References Cited

U.S. PATENT DOCUMENTS

| 4,736,128 A | * | 4/1988 | Takoshima et al. | ..... 310/313 R |
| 5,508,561 A | | 4/1996 | Tago et al. | |
| 5,699,027 A | * | 12/1997 | Tsuji et al. | .......... 310/313 R X |
| 5,821,665 A | * | 10/1998 | Onishi et al. | ........... 310/313 R |

FOREIGN PATENT DOCUMENTS

| EP | 0 682 408 A1 | | 11/1995 | |
| EP | 0 742 643 A1 | | 11/1996 | |
| JP | 0139513 | * | 8/1983 | ............. 310/313 R |
| JP | 404167709 | * | 6/1992 | ............. 310/313 R |
| JP | 8-78999 | | 3/1996 | |
| JP | 10 013184 A | | 4/1998 | |

OTHER PUBLICATIONS

AP Kazuo Eda et al., Flip–Chip bonding Technology Fabricates GHZ–Band Saw Filters, Jee Journal of Electronic Engineering, JP, Dempa Publications Inc., Tokyo; vol. 30, No. 324; Dec. 1993; p. 37, column 2, line 1–p. 38, column 3, line 16; figures 3,4.

* cited by examiner

*Primary Examiner*—Mark O. Budd
(74) *Attorney, Agent, or Firm*—Keating & Bennett, LLP

(57) ABSTRACT

A surface acoustic wave element includes a surface acoustic wave substrate, an interdigital transducer electrode provided on the surface acoustic wave substrate and a lead electrode provided on the surface acoustic wave substrate. The lead electrode is connected to the interdigital transducer electrode. The surface acoustic wave element further includes a bump electrode provided on a portion of the lead electrodes. The bump electrode includes a first electrode structure and a second electrode structure. The first electrode structure has a top surface and is arranged in contact with the lead electrode, and the second electrode structure covers a portion of the top surface of the first electrode structure such that the remaining portion of the top surface of the first electrode structure is exposed along an entire periphery of the top surface of the first electrode structure.

21 Claims, 2 Drawing Sheets

SURFACE ACOUSTIC WAVE ELEMENT HAVING A BUMP ELECTRODE AND SURFACE ACOUSTIC WAVE DEVICE COMPRISING THE SAME

FIELD OF THE INVENTION

The present invention relates to a surface acoustic wave element having a bump electrode and a surface acoustic wave device in which a SAW element is mounted on a base substrate through a solder bump connection.

DESCRIPTION OF THE RELATED ART

A conventional surface acoustic wave (SAW) device includes a SAW element which is mounted on a base substrate via a solder bump connection and the SAW element is sealed by bonding a metal cap to the base substrate via soldering. FIG. 4 is a sectional view showing a bump electrode of a conventional SAW element in such a SAW device.

The conventional SAW element shown in FIG. 4 includes a surface wave substrate 11, an interdigital transducer (IDT) electrode (not illustrated), a reflector electrode (not illustrated) and a lead electrode 14 connected to the IDT electrode and disposed on one main surface of the surface wave substrate 11. A bump electrode 40 is disposed at an end portion of the lead electrode 14. The lead electrode 14 and the bump electrode 40 are formed by a method of vapor deposition, sputtering or the like. The lead electrode 14 is made of Al. The bump electrode 40 normally comprises a plurality of metal layers, such as a NiCr layer 40a, an Ni layer 40b and an Ag layer 40c having the same shape, as shown in FIG. 4.

The SAW element shown in FIG. 4 is fixedly supported by a base electrode and electrically connected thereto via soldering (solder bump connection) the bump electrode 40 of the SAW element to a corresponding electrode land on the base substrate. More specifically, after preliminary soldering is carried out on the electrode land of the base substrate, the bump electrode of the SAW element is soldered to the electrode land of the base substrate via a reflow soldering process.

A metal cap is then soldered to a bonding area of the base substrate to cover the SAW element and the SAW element is therefore sealed inside of a closed inner space formed by the base substrate and the metal cap.

Although such a solder bump connection is a well-established technique and is used widely in various kinds of electronic components, the conventional SAW device has a problem with the solder bump connection. More specifically, when the SAW element is soldered to the base substrate, molten solder flows along a peripheral side of the bump electrode 40 and reaches a lead electrode of the SAW element such that a portion of the solder is in contact with the lead electrode. Since the lead electrode is made of a thin aluminum layer, there arises a problem that the lead electrode reacts with or is eroded by the solder thereby causing a connection failure of the lead electrode 14 and degradation of the device characteristic due to the connection failure.

SUMMARY OF THE INVENTION

The preferred embodiments of the present invention overcome the problems described above by providing a surface acoustic wave element which eliminates corrosion of an Al electrode caused by a reaction with solder when the element is mounted on a base substrate via soldering.

The preferred embodiments of the present invention overcome the problems described above by providing a surface acoustic wave device which prevents degradation of the device characteristics caused by a connection failure of a lead electrode.

A preferred embodiment of the present invention provides a surface acoustic wave element including a surface acoustic wave substrate, an interdigital transducer electrode provided on the surface acoustic wave substrate and a lead electrode provided on the surface acoustic wave substrate. The lead electrode is connected to the interdigital transducer electrode. The surface acoustic wave element further includes a bump electrode provided on a portion of the lead electrodes. The bump electrode includes a first electrode structure and a second electrode structure. The first electrode structure has a top surface and is in contact with the lead electrode, and the second electrode structure covers a portion of the top surface of the first electrode structure such that the remaining portion of the top surface of the first electrode structure is exposed along a whole periphery of the top surface of the first electrode structure.

The surface acoustic wave device according to another preferred embodiment preferably includes a surface acoustic wave element constructed according to the preferred embodiment described above, a base substrate having electrode lands and a bond land on a surface thereof and a cap. The surface acoustic wave element is mounted on the base substrate such that the bump electrodes of the surface acoustic wave element are soldered to the respective electrode lands of the base substrate. The cap has an opening and a flange portion defining the opening, and the flange portion is soldered to the bond land of the base substrate such that the surface acoustic wave element is sealed by the cap and the base substrate.

The first electrode structure may preferably include a layer having poor solder wettability and defining a top surface thereof. This layer is preferably made of Al. The first electrode structure may further include a pair of NiCr layers and a Ni layer disposed between the pair of NiCr layers. Alternatively, the first electrode structure may preferably include only a NiCr layer or a Ni layer.

The second electrode structure may preferably include an Ag layer which defines a top surface of the second electrode structure. Moreover, the second electrode structure may further include a NiCr layer and a Ni layer disposed between the Ag layer and the NiCr layer.

The first electrode structure further preferably has a side surface which is substantially perpendicular to the top surface. The top surface of the first electrode structure may have a substantially circular shape and the second electrode structure has a top surface having a substantially circular shape which is smaller than the top surface of the first electrode structure. The top surface of the first electrode structure and the top surface of the second electrode structure are preferably arranged so as to be aligned with each other at center thereof.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings.

Figure 1:
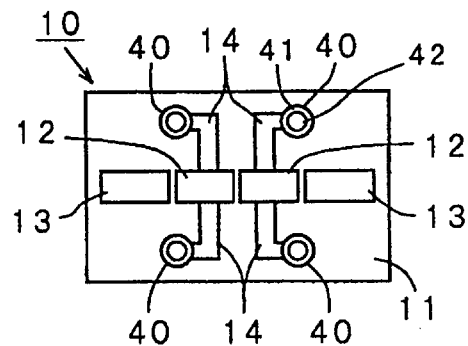
FIG. 1 is a schematic plan view of a SAW element according to a preferred embodiment of the present invention.
Figure 2A:
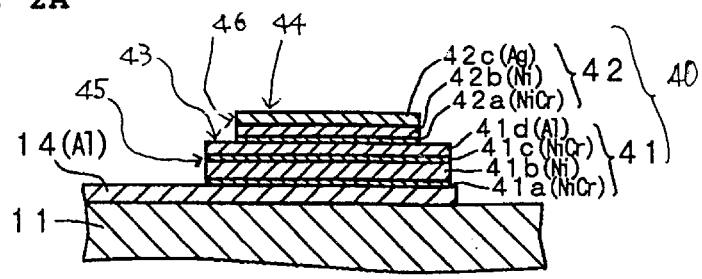
FIG. 2A is an enlarged sectional view of a bump electrode of the SAW element shown in FIG. 1.
Figure 2B:
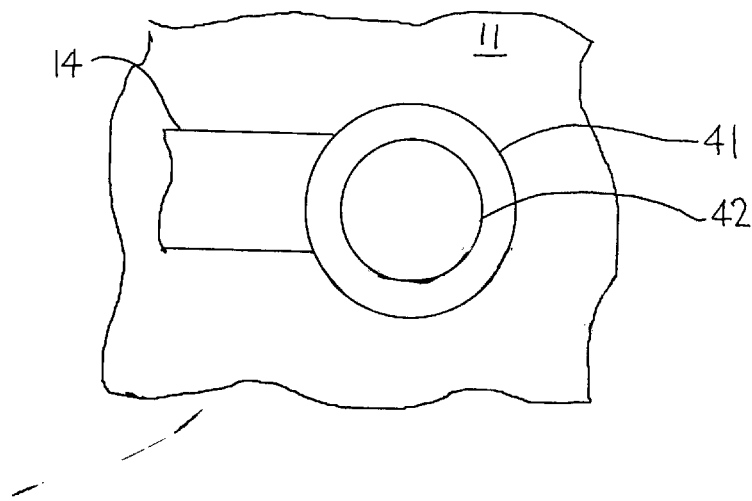
FIG. 2B is an enlarged plan view showing a bump electrode of the SAW element shown in FIG. 1.
Figure 3:
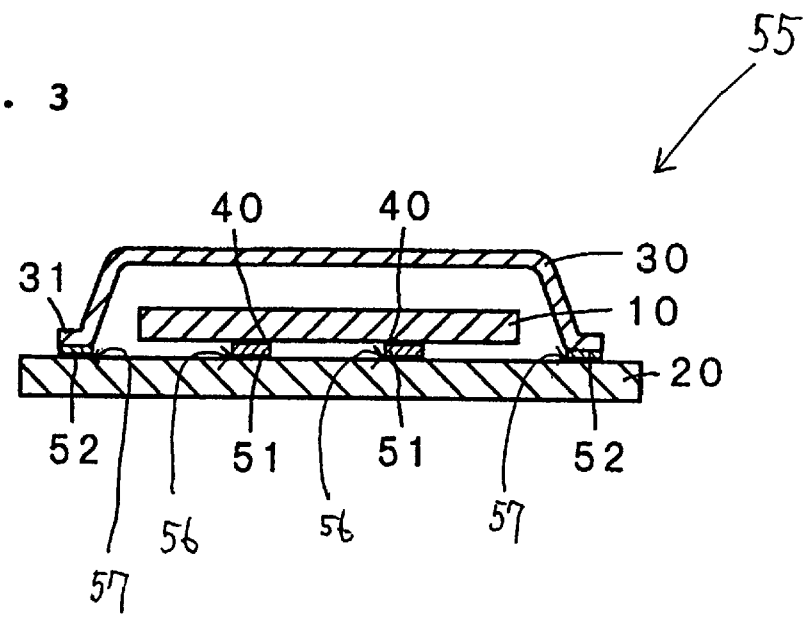
FIG. 3 is a sectional view of a surface acoustic wave device according to a preferred embodiment of the present invention.
Figure 4:
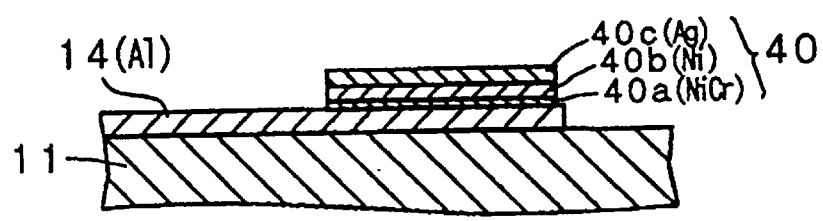
FIG. 4 is an enlarged sectional view showing a bump electrode of a conventional SAW element.

FIG. 1 is a schematic plan view of an SAW element according to a preferred embodiment of the present invention, and FIGS. 2A and 2B are an enlarged sectional view and an enlarged plan view, respectively, showing a bump electrode of the SAW element shown in FIG. 1. FIG. 3 is a sectional view of a surface acoustic wave device in which the SAW element shown in FIG. 1 is contained.

As shown in FIG. 1, a SAW element 10 of this preferred embodiment includes a surface acoustic wave substrate 11, two IDT electrodes 12 and a pair of reflector electrodes 13. The IDT electrodes 12 are preferably located at a substantially central portion of one main surface of the surface wave substrate 11, and the pair of reflector electrodes 13 are provided on the main surface of the surface wave substrate 11 such that the two IDT electrodes 12 are located between the pair of reflector electrodes 13. The SAW element 10 further includes lead electrodes 14 connected to the respective IDT electrodes 12 and bump electrodes 40 disposed on end portions of the respective lead electrodes 14. The IDT electrodes 12, the reflector electrodes 13 and the lead electrodes 14 are preferably made of Al and are preferably formed by a method of vapor deposition, sputtering or other suitable method.

Although the SAW element 10 includes two IDT electrodes 12 and the pair of reflector electrodes 14 so as to define an inline-coupled resonator filter, it is understood that the SAW element may be any other type of filter or resonator. It is also noted that the SAW element 10 may be an edge-reflection type resonator or filter.

As shown in FIGS. 2A and 2B, the bump electrode 40 includes a first electrode structure 41 having a plurality of layers and a second electrode structure 42 having a plurality of layers. The first electrode structure 41 is provided on the lead electrode 14, and the second electrode structure 42 is provided on the first electrode structure 41. The first electrode structure 41 and the second structure 42, respectively, have substantially circular top surfaces 43 and 44 and have side surfaces 45 and 46 which are substantially perpendicular to the top surfaces 43 and 44. As is best shown in FIG. 2B, the diameter of the top surface 44 of the second electrode structure 42 is preferably smaller than the diameter of the top surface 43 of the first electrode structure 41. In addition, the second electrode structure 42 is preferably stacked on the first electrode structure 41 so as to be aligned therewith at a center thereof. As a result, a ring shaped portion of the top surface 43 is exposed along the side surface 46 of the second electrode structure 42. In this preferred embodiment, the diameters of the top surface 43 and the top surface 44 may be set to be, for example, about 0.68 mm and about 0.50 mm, respectively.

The shape and size of the first electrode structure 41 and the second electrode structure 42 may be different from a circle and the aforementioned size as long as the second electrode structure 42 covers a portion of the top surface of the first electrode structure 41 such that the remaining portion of the top surface 43 of the first electrode structure 41 is exposed along the whole periphery of the top surface 43. The first electrode structure 41 and/or the second electrode structure 42 may have a substantially ellipsoidal shape, a substantially rectangular shape, a substantially triagonal shape, or other suitable shapes.

The first electrode structure 41 is provided to prevent solder from reaching the lead electrode 12 and to prevent corrosion of the lead electrode 14 caused by soldering in the solder bump connection. Specifically, the first electrode structure 41 preferably includes a plurality, preferably four, of layers including: an NiCr film 41a preferably having a film thickness of about 80 nm; an Ni film 41b preferably having a film thickness of about 600 nm; an NiCr film 41c preferably having a film thickness of about 80 nm; and an Al film 41d preferably having a film thickness of about 300 nm. NiCr, which has large adhesion strength for bonding to Al, is preferably used for an electrode material of the first layer (lowermost layer) and the third layer. Al, which has poor solder wettability, is preferably used for an electrode material of the uppermost layer. Ni, which prevents diffusion of solder, is preferably used for the electrode material of the second layer.

The second electrode structure 42 is preferably directly soldered by the solder bump connection and preferably includes a plurality, preferably three, layers including: an NiCr film 42a preferably having a film thickness of about 80 nm; an Ni film 42b preferably having a film thickness of about 300 nm; an Ag film 42c preferably having a film thickness of about 300 nm. NiCr, which has large adhesion strength for bonding to Al, is preferably used for an electrode material of the first layer (lowermost layer). Ag, which has excellent solderability and soldering strength, is preferably used for an electrode material of an uppermost layer, and Ni, which prevents diffusion of solder, is preferably used for an electrode material of the second layer.

The first electrode structure 41 and the second electrode structure 42 are preferably formed by a so-called lift off process in which resist patterns having opening portions corresponding to the respective shapes are formed by photoresists and the respective electrode materials are successively deposited to have a predetermined thickness by a known deposition technique and thereafter, the resists are removed. As a result of the lift off process, the side surfaces 45 and 46 of the bump electrode 40 have a significantly increased steepness in vertical dimension than that formed by other methods with respect to the surface wave substrate 11. The steepness of the side surfaces 45 and 46 help to prevent the solder from flowing along the side surfaces 45 and 46 from the top surface 44 to the lead electrode 14.

FIG. 3 is a sectional view of a surface acoustic wave device according to a preferred embodiment of the present invention. As shown in FIG. 3, a SAW device 55 includes the SAW element 10, a base substrate 20 with electrode lands 56 and a cap 30. The SAW device 55 is preferably a surface mount component and is mounted on a substrate with the bottom surface of the base substrate 20 facing downwardly.

As shown by FIG. 3, the bump electrodes 40 of the above-described SAW element 10 are soldered to respective electrode lands 56 on a base substrate 20 via solder 51 (solder bump connection), whereby the SAW element 10 is fixedly supported by and electrically connected to the base substrate 20. Further, a metal cap 30 having an opening is soldered to a bonding land 57 of the base substrate 20 via solder 52 at a flange portion 31 thereof to cover the SAW element 10 and the SAW element 10 is sealed in a closed space formed by the base substrate 20 and the metal cap 30.

Preliminary soldering is carried out previously on the electrode lands 56 of the base substrate 20. The connection and bonding of the SAW element 10 and the metal cap 30 to the base substrate 20 by solder is performed preferably by a reflow soldering process, thereby producing a SAW device 55.

As described above, according to the SAW device of this preferred embodiment, the bump electrode 40 includes the two electrode structures 41 and 42 having different outer diameters. The second electrode structure 42 at the upper portion that is soldered is preferably smaller than the outer periphery of the lower portion of the first electrode structure 41 located on the Al electrode at the lower portion. Al, which is the electrode material having poor solder wettability is used for the uppermost layer, i.e., the exposed top surface 43 of the first electrode structure 41. Therefore, the solder which has spread on the side surface 46 of the second electrode structure 42 and has reached the first electrode structure 41 does not wet and spread on the exposed portion of the top surface 43 of the first electrode structure 41 and does not reach the lead electrode 14 made of Al by spreading on the side surface 45 of the first electrode structure 41.

Further, Ni, which is the electrode material constructed for preventing diffusion of solder, is used for the second layer as the Ni film 41b in the first electrode structure 41. Thus, solder is prevented from permeating in a thickness direction of the first electrode structure 41 and from being in contact of with the lead electrode 14 by diffusion.

Further, since the bump electrode 40 includes the two electrode structures 41 and 42, the thickness of the bump electrode 40 is greater than conventional bump electrodes. The two electrode structure configuration also significantly reduces the possibility for the solder to contact the lead electrode 14 by flowing along the side surfaces 45 and 46 or permeating the bump electrode 40.

Accordingly, the lead electrode made of Al is effectively prevented from contacting the solder in the solder bump connection, and corrosion of the lead electrode by solder is reliably prevented. Thus, a surface acoustic wave device having high reliability is achieved.

Although the specific structure of the first and second electrode structures are explained above, the elements and specific arrangement of the first electrode structure and the second electrode structure are not limited to the specific details of the above-described embodiment. The first electrode structure may include three layers of NiCr/Ni/Al or the first electrode structure may include a single layer of NiCr or Ni. Further, the shapes or dimensions of the first electrode structure and the second electrode structure are not limited to the specific details of the above-described preferred embodiments but shapes other than the substantially circular shape may be used.

Further, the method of forming the bump electrode is not limited to the lift off process described above. The bump electrode may be formed by using another method such as a mask vapor deposition process or other suitable method.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
    a surface acoustic wave substrate;
    an interdigital transducer electrode located on the surface acoustic wave substrate;
    a lead electrode located on the surface acoustic wave substrate, the lead electrode being connected to the interdigital transducer electrode; and
    a bump electrode located on a portion of the lead electrodes, the bump electrode including a first electrode structure and a second electrode structure, the first electrode structure having a top surface and being disposed in contact with the lead electrode, and the second electrode structure arranged to cover a portion of the top surface of the first electrode structure such that a remaining portion of the top surface of the first electrode structure is exposed along an entire periphery of the top surface of the first electrode structure;
    wherein the second electrode structure comprises an Ag layer which defines a top surface of the second electrode structure.

2. A surface acoustic wave device according to claim 1, wherein the first electrode structure comprises a layer having a poor solder wettability and defining the top surface.

3. A surface acoustic wave device according to claim 2, wherein the layer is made of Al.

4. A surface acoustic wave device according to claim 3, wherein the first electrode structure further comprises a pair of NiCr layers and a Ni layer disposed between the pair of NiCr layers.

5. A surface acoustic wave device according to claim 1, wherein the first electrode structure comprises a NiCr layer.

6. A surface acoustic wave device according to claim 1, wherein the first electrode structure comprises a Ni layer.

7. A surface acoustic wave device according to claim 1, wherein the second electrode structure further comprises a NiCr layer and a Ni layer disposed between the Ag layer and NiCr layer.

8. A surface acoustic wave device according to claim 1, wherein the first electrode structure has a side surface which is substantially perpendicular to the top surface.

9. A surface acoustic wave device according to claim 1, wherein the top surface of the first electrode structure has a substantially circular shape and the second electrode structure has a top surface having a substantially circular shape which is smaller than the top surface of the first electrode structure.

10. A surface acoustic wave device according to claim 1, wherein the top surface of the first electrode structure and the top surface of the second electrode structure are arranged so as to be aligned at a center thereof.

11. A surface acoustic wave device comprising:
    a base substrate having electrode lands and a bond land on a surface thereof;
    a surface acoustic wave element including a surface acoustic wave substrate, an interdigital transducer electrode located on the surface acoustic wave substrate; a lead electrode located on the surface acoustic wave substrate, the lead electrode being connected to the interdigital transducer electrode; and bump electrodes located on a portion of the lead electrodes, each of the bump electrodes including a first electrode structure and a second electrode structure, the first electrode structure having a top surface and being in contact with the lead electrode, and the second electrode structure covering a portion of the top surface of the first electrode structure such that a remaining portion of the top surface of the first electrode structure is exposed along an entire periphery of the top surface the first electrode structure; wherein the surface acoustic wave element is mounted on the base substrate such that the bump electrodes of the surface acoustic wave element are soldered to the respective electrode lands of the base substrate; and a cap having an opening and a flange portion defining the opening, the flange portion being soldered to the bond land of the base substrate such that the surface acoustic wave element is sealed by the cap and the base substrate.

12. A surface acoustic wave device according to claim 11, wherein the first electrode structure comprises a layer having a poor solder wettability and defining the top surface.

13. A surface acoustic wave device according to claim 12, wherein the layer is made of Al.

14. A surface acoustic wave element according to claim 11, wherein the first electrode structure further comprises a pair of NiCr layers and a Ni layer disposed between the pair of NiCr layers.

15. A surface acoustic wave element according to claim 11, wherein the second electrode structure comprises a Ag layer which defining a top surface of the second electrode structure.

16. A surface acoustic wave element according to claim 11, wherein the second electrode structure further comprises a NiCr layer and a Ni layer disposed between the Ag layer and NiCr layer.

17. A surface acoustic wave element according to claim 11, wherein the first electrode structure further has a side surface which is substantially perpendicular to the top surface.

18. A surface acoustic wave element according to claim 11, wherein the top surface of the first electrode structure has a substantially circular shape and the second electrode structure has a top surface having a substantially circular shape which is smaller than the top surface of the first electrode structure, and the top surface of the first electrode structure and the top surface of the second electrode structure are arranged so as to be aligned at a center thereof.

19. A surface acoustic wave device comprising:

a base substrate having electrode lands on a surface thereof;

a surface acoustic wave element including a surface acoustic wave substrate, an interdigital transducer electrode provided on the surface acoustic wave substrate, a lead electrode provided on the surface acoustic wave substrate, the lead electrode being connected to the interdigital transducer electrode, and bump electrodes provided on a portion of the lead electrodes, each of the bump electrodes including a first electrode structure and a second electrode structure, the first electrode structure having a top surface and being in contact with the lead electrode, and the second electrode structure covering a portion of the top surface of the first electrode structure such that the remaining portion of the top surface of the first electrode structure is exposed along a whole periphery of the top surface of the first electrode structure, wherein the surface acoustic wave element is mounted on the base substrate in a face down arrangement such that the bump electrodes of the surface acoustic wave element are soldered to the respective electrode lands of the base substrate, the first electrode structure includes a layer having a relatively poor solder wettability and defining the top surface, and the second electrode structure includes a layer having a relatively excellent solderability and defining a top surface of the second electrode structure, wherein the second electrode structure comprises an Ag layer which defines a top surface of the second electrode structure.

20. A surface acoustic wave device according to claim 19, wherein the second electrode structure further comprises a NiCr layer and a Ni layer disposed between the Ag layer and NiCr layer.

21. A surface acoustic wave device according to claim 19, wherein the first electrode structure has a side surface which is substantially perpendicular to the top surface.

* * * * *